United States Patent [19]

Ogino

[11] Patent Number: 5,023,696
[45] Date of Patent: Jun. 11, 1991

[54] SEMICONDUCTOR DEVICE HAVING COMPOSITE SUBSTRATE FORMED BY FIXING TWO SEMICONDUCTOR SUBSTRATES IN CLOSE CONTACT WITH EACH OTHER

[75] Inventor: Masanobu Ogino, Yokosuka, Japan

[73] Assignee: Kabushiki Kaisha Toshiba, Kawasaki, Japan

[21] Appl. No.: 305,652

[22] Filed: Feb. 3, 1989

[30] Foreign Application Priority Data

Feb. 4, 1988 [JP] Japan ................... 63-22803

[51] Int. Cl.⁵ .................. H01L 29/04; H01L 29/10; H01L 29/74
[52] U.S. Cl. .................. 357/60; 357/23.4; 357/38; 357/39; 357/91
[58] Field of Search ............ 357/60, 91, 23.4, 38, 357/39

[56] References Cited

U.S. PATENT DOCUMENTS

| | | | |
|---|---|---|---|
| 4,291,329 | 9/1981 | Hanes et al. | 357/91 |
| 4,534,804 | 8/1985 | Cade | 357/91 |
| 4,587,713 | 5/1986 | Goodman et al. | 357/91 |
| 4,632,712 | 12/1986 | Fan et al. | 357/60 |
| 4,684,964 | 8/1987 | Pankove et al. | 357/52 |
| 4,766,482 | 8/1988 | Smeltzer et al. | 357/91 |

OTHER PUBLICATIONS

Mogro-Campero et al., "Temperature Behavior and Annealing of Insulated Gate Transistors Subjected to Localized Lifetime Control by Proton Implantation", Solid-State Electronics, vol. 30, No. 2, pp. 185-188, 1987.

Primary Examiner—Andrew J. James
Assistant Examiner—Ngan Van Ngo
Attorney, Agent, or Firm—Oblon, Spivak, McClelland, Maier & Neustadt

[57] ABSTRACT

A semiconductor element is formed in a composite substrate constructed by fixing two semiconductor substrates in close contact with each other, and crystal defects are formed in that portion of at least one of the two semiconductor substrates which lies near the junction plane of the two semiconductor substrates. The crystal defects act as the center of the recombination of excess minority carriers accumulated in an active region of the semiconductor element.

12 Claims, 9 Drawing Sheets

SEMICONDUCTOR DEVICE HAVING COMPOSITE SUBSTRATE FORMED BY FIXING TWO SEMICONDUCTOR SUBSTRATES IN CLOSE CONTACT WITH EACH OTHER

BACKGROUND OF THE INVENTION

1. Field of the Invention

This invention relates to a semiconductor device having a composite substrate formed by fixing two semiconductor substrates in close contact with each other, and more particularly to a high speed switching semiconductor device in which it is necessary to rapidly extinguish accumulated charges.

2. Description of the Related Art

Various types of semiconductor devices require a high speed switching operation. For example, an insulated gate bipolar transistor (which is often called simply an IGBT or conductivity modulation type MOS FET and is hereinafter referred to as IGBT) is well known in the art as a high speed switching semiconductor device. An IGBT is disclosed in, for example, U.S. Pat. No. 4,700,466 and EP-0192229, and is constructed by sequentially forming an $N^+$-type region of high impurity concentration and an $H^-$-type region of low impurity concentration on a $P^+$-type semiconductor substrate of high impurity concentration by means of epitaxial growth, and then forming a vertical type double diffusion MOS FET (which is hereinafter referred to as a VD MOS FET) in the $N^-$-type region. In other words, the above IGBT is obtained by additionally forming the $P^+$-type region in the $N^+$-type drain region of the VD MOS FET.

When the above IGBT is in the ON state, majority carriers (electrons) diffuse from the source region into the drain region, and minority carriers (holes) move from the $P^+$-type region into the drain region. As a result, a large amount of excessive minority carriers remain in the drain region in comparison with a VD MOS FET in the same (i.e. ON) state, and for this reason, the forward voltage (Vf) of the IGBT can be set to be small even when a large current passes therethrough, the IGBT has a high withstanding voltage, as in the case of the VD MOS FET, and can be rapidly turned off through control of the gate voltage.

On the other hand, the turn-off characteristic of the IGBT may be degraded, on account of the presence of the minority carriers accumulated in the drain region, and in order to solve this problem, a method whose purpose is to shorten the lifetime of the minority carriers in the drain region has been employed in the prior art. More precisely, a deep level acting as the center of recombination of the carriers is formed over the entire area of the substrate by applying an electron beam to the substrate or diffusing a heavy metal such as Au, Pt into the substrate. In general, the lifetime controlling method may cause the lifetime of carriers to be shortened and the operation speed of the semiconductor device to be enhanced; however, it does have the disadvantage that the leak current flowing in the semiconductor device set in the forward blocking condition is increased, as is also the forward voltage or ON-voltage (Vf).

As described above, the IGBT is advantageous over the VD MOS FET in that the ON-voltage can be kept low even when a large current is caused to flow, but has the disadvantage that the turn-off characteristic is degraded. Using the prior art technique to solve this problem, results an increase in the leak current as well as in the ON-voltage (Vf).

SUMMARY OF THE INVENTION

An object of this invention is accordingly to provide a high speed switching semiconductor device in which any increase in the ON-voltage (Vf) and the leak current can be suppressed to a minimum, and good turnoff characteristics attained.

According to one embodiment of this invention, there is provided a semiconductor device comprising a first semiconductor substrate; a second semiconductor substrate having crystal defects near the main surface which is fixed in close contact with the surface of the first semiconductor substrate; and at least one semiconductor element formed in a composite substrate, itself formed by fixing the first and second semiconductor substrates in close contact with each other.

By virtue of the above construction the crystal defect formed near the junction plane between the first and second semiconductor substrates acts as the center of the recombination of carriers, so as to shorten the lifetime of the carriers in the region. In a power switching device, excessive minority carriers accumulated in a specified active region during the period of ON-state must be rapidly removed at the time of transition from the ON-state to the OFF-state. In this regard, the crystal defect used in this embodiment has the effect of accelerating the rate of reduction of the excessive minority carriers and shortening the turn-off time.

It should be noted, at this time, that the crystal defect is formed only in an area near the junction plane between the first and second semiconductor substrates and is formed in a deep portion of the substrate so as not to affect the characteristic of the semiconductor element. As a result, any increase in the leak current (OFF current and reverse current) and in the ON-voltage (Vf) can be suppressed to a minimum.

Thus, according to this invention, a high speed switching semiconductor device can be obtained in which any increase in the leak current and ON-voltage (Vf) can be suppressed to a minimum, and excellent turn-off characteristics can be attained.

DETAILED DESCRIPTION OF THE PREFERRED EMBODIMENTS

Figure 1:
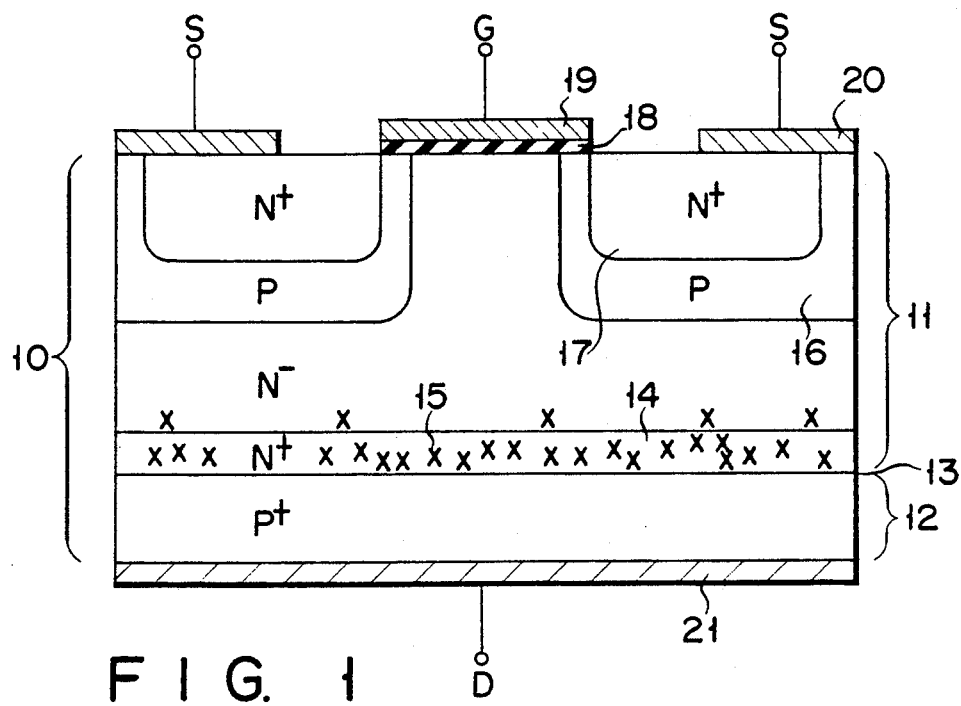
FIG. 1 is a cross sectional view of an IGBT as a semiconductor device according to a first embodiment of this invention.

FIG. 1 is a cross sectional view of a semiconductor device according to a first embodiment of this invention. This semiconductor device is an IGBT to which the invention relates, and is formed in composite substrate 10, which is itself formed by fixing N$^-$-type semiconductor substrate 11 and P$^+$-type semiconductor substrate 12 in close contact with each other. N$^+$-type region 14 is formed in that surface area of substrate 11 which lies on the side of junction plane 13 between substrates 11 and 12, and crystal defects 15 (indicated by mark X) of deep energy level are formed in N$^+$-type region 14. In addition, a VD MOS FET is formed in N$^-$-type substrate 11. More specifically, P-type impurity region (P body region) 16 having an annular plane pattern is formed in the main surface area of substrate 11, and N$^+$-type impurity region (source region) 17 is formed in the surface area of P-type impurity area 16. Gate insulation film 18 is formed on that portion of substrate 11 which is surrounded by N$^+$-type impurity region 17, and gate electrode 19 is formed on gate insulation film 18. Source electrode 20 is formed on part of N$^+$-type impurity region 17 and an adjacent part of P-type impurity region 16, and drain electrode 21 is formed on the back surface of substrate 12, opposite to junction plane 13.

Figure 2A:
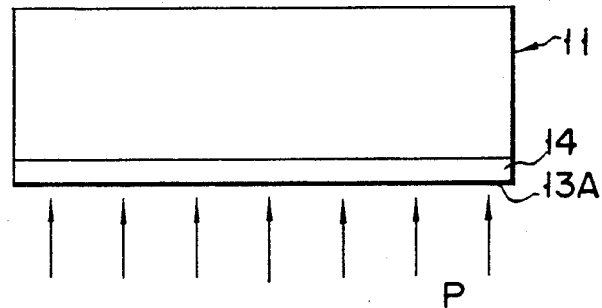
FIGS. 2A to 2K are cross sectional views sequentially showing the steps of manufacturing the IGBT shown in FIG. 1.

FIGS. 2A to 2K are cross sectional views showing the sequence of steps in the manufacturing of the IGBT shown in FIG. 1. First, surface (contact surface) 13A of N$^-$-type silicon substrate (having Miller indices (100)) 11, doped with phosphorus (P) so as to have a resistivity of 60 to 80 Ω·cm is polished to a mirror finish having a surface roughness or unevenness of less than 130 Å. Then, as shown in FIG. 2A, phosphorus ions are implanted by ion-implantation, under an acceleration energy of 40KeV and a dose amount of $2 \times 10^{15}$ atoms/cm$^2$, into that portion of substrate 11 which lies near contact surface 13A, thereby forming N$^+$-type region 14.

Figure 2B:
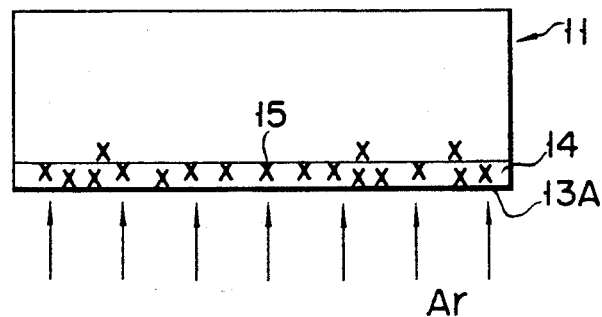
Figure 2C:
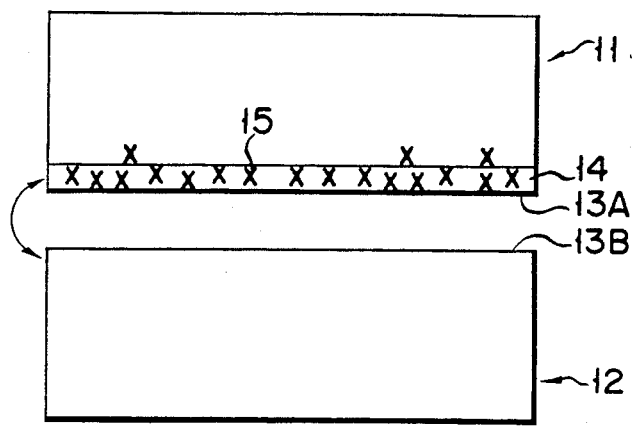
Figure 2D:
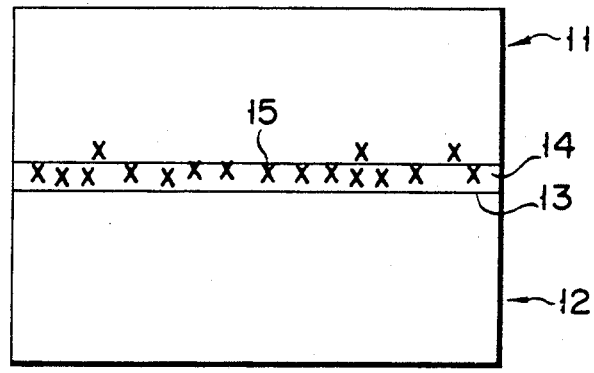

Next, as shown in FIG. 2B, Ar ions are implanted by ion-implantation into substrate 11 (on the side of contact surface 13A), under an acceleration energy of 150KeV and a dose amount of $3 \times 10^{15}$ atoms/cm$^2$, as a result of which, crystal defects 15 are formed in that portion of N$^+$-type region 14 which lies near contact surface 13A.

After this, P$^+$-type silicon substrate 12 of Miller indices (100), which is doped with boron so as to have a resistivity of 0.013 to 0.016 Ω·cm, is prepared, and one of its surfaces (contact surface 13B) is polished to a mirror finish having an unevenness of less than 130 Å. Thereafter, N$^-$-type substrate 11 and P$^+$-type substrate 12 are cleaned and subjected to a degreasing process, and the natural oxide film formed on the substrate surface is removed. Contact surfaces 13A and 13B substrates 11 and 12 are then washed by clean water for a few minutes, after which they are subjected to a dehydration process (such as spinning process) at room temperature. In the course of the dehydration process, only excess water should be removed, leaving the water adsorbed on the surface of substrates 11 and 12. Because of this, a dehydration process involving heating at a temperature higher than 100° C. is not suitable, since this would result in substantially all the water adsorbed on the substrate surface being vaporized. After being subjected to a suitable dehydration process, substrates 11 and 12 are placed in close contact with each other in a clean atmosphere of class 1 (in which only one dust particle larger than 0.3 μm is present per 1 ft$^3$) with virtually no foreign matter being present between contact surfaces 13A and 13B (shown in FIG. 2C).

Figure 2E:
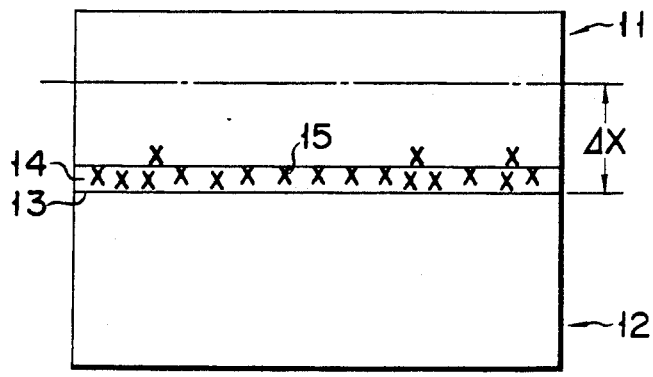

Next, a heat treatment is effected at a temperature of 1100° C. for two hours in an atmosphere of O$_2$ and N$_2$ in a ratio of 1:4. This process strengthens the bond between the atoms of substrates 11 and 12 at the contact surface or junction plane 13 (shown in FIG. 2D); more precisely, substrates 11 and 12 are fixed in close contact with each other. Then, as shown in FIG. 2E, the surface of substrate 11 is polished until distance (the thickness of substrate 11) ΔX from junction plane 13 to the surface of N$^-$-type substrate 11 becomes 110 μm, and thus the main surface of substrate 11 becomes mirrorlike.

Figure 2F:
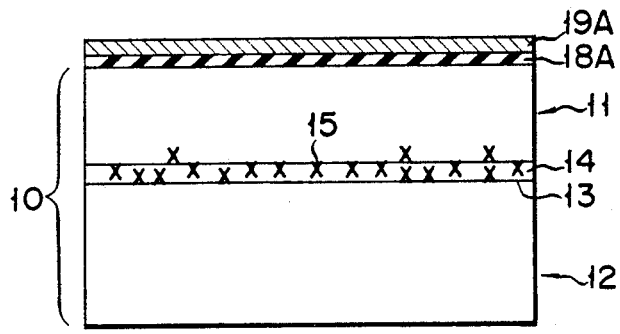
Figure 2G:
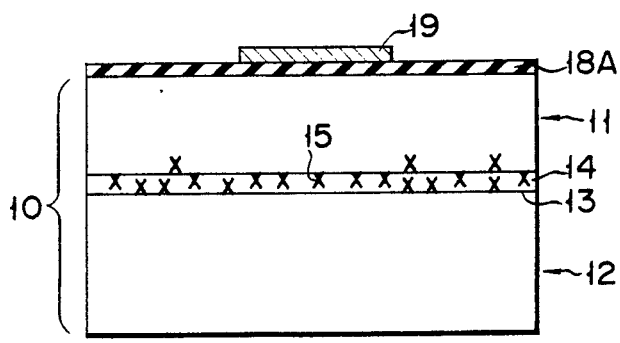
Figure 2H:
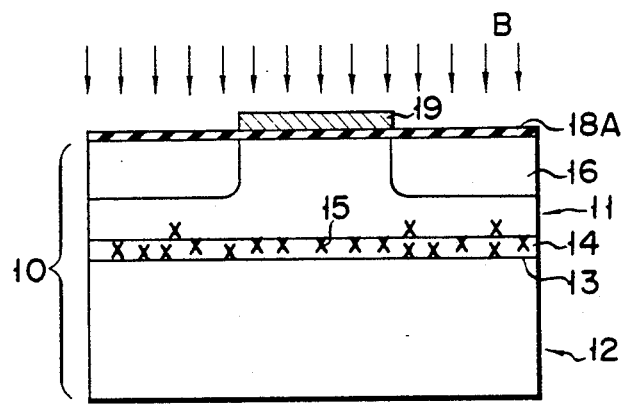
Figure 2I:
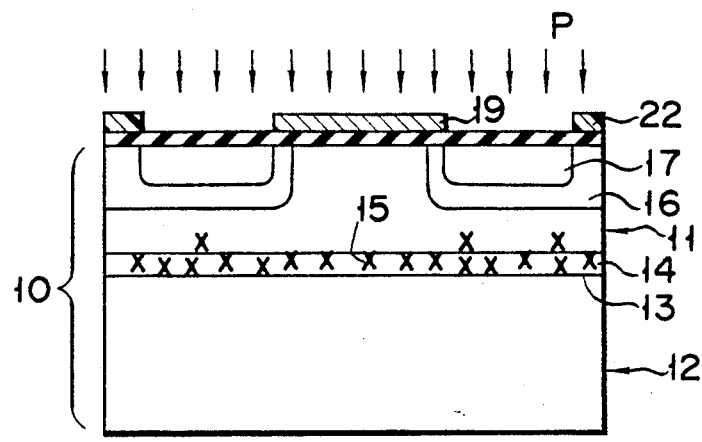
Figure 2J:
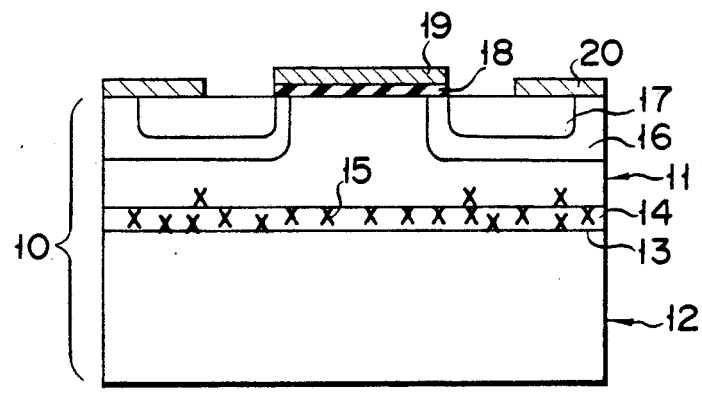
Figure 2K:
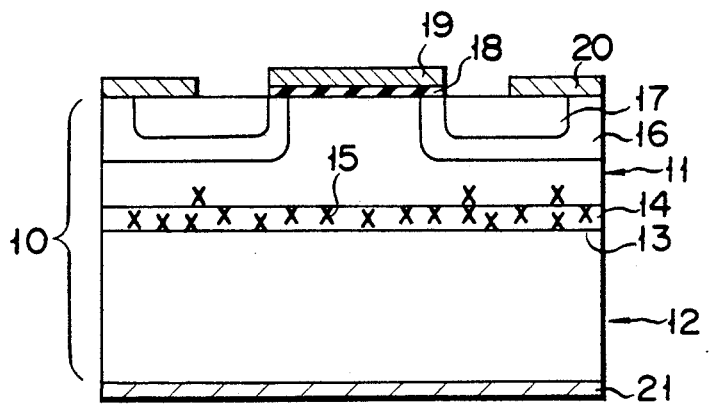

After this, a VD MOS FET is formed in the main surface area of composite substrate 10 by use of a well known manufacturing method, and the IGBT of the construction shown in FIG. 1 is attained. Specifically, as is shown in FIG. 2F, silicon oxide film 18A is formed on the main surface (the main surface of substrate 11) of composite substrate 10 which is formed by fixing substrates 11 and 12 in close contact with each other. Polysilicon layer 19A is formed on silicon oxide film 18A, and then, as shown in FIG. 2G, gate electrode 19 is formed by patterning polysilicon layer 19A, using a PEP method. P body region 16 is then formed by ion-implanting a P-type impurity such as boron into the surface area of substrate 11, with gate electrode 19 being used as a mask (shown in FIG. 2H), and at this time, P body region 16 diffuses into part of the region under gate electrode 19, during the heat treatment effected to activate region 16. N$^+$-type source region 17 is then formed by ion-implanting an N-type impurity such as phosphorus into the surface area of P body region 16, with gate electrode 19 and resist pattern 22 serving as a mask (shown in FIG. 2I), and gate insulation film 18 is formed by etching silicon oxide film 18A, with gate electrode 19 acting as a mask. As a result, the surface of substrate 10 is partly exposed. Source electrode 20 is then formed on part of N$^+$-type source region 17 and an adjacent part of P body region 16 (shown in FIG. 2J), electrode 20 being formed, for example, of aluminum. After this, drain electrode 21 composed of Au or an Au alloy (for example, Ba-Ni-Au), is formed on the back surface of substrate 10 (shown in FIG. 2K).

It has been proved, by means of a transmission electron microscope, that crystal defects 15 formed by ion-implanting Ar ions into substrate 11 are formed of polycrystalline silicon.

As described above, in the IGBT having crystal defects 15 formed only in N$^+$-type drain region 14, the rate of rise in the forward ON-voltage (Vf) can be suppressed to a minimum in comparison with the prior art IGBT in which the crystal defects are distributed throughout the entire area of the drain. Since, therefore, there are no crystal defects 15 in the depletion layer formed in N$^-$-type region (substrate) 11, the leak current (OFF current) will not increase at the time of application of a forward blocking voltage.

Figure 3:
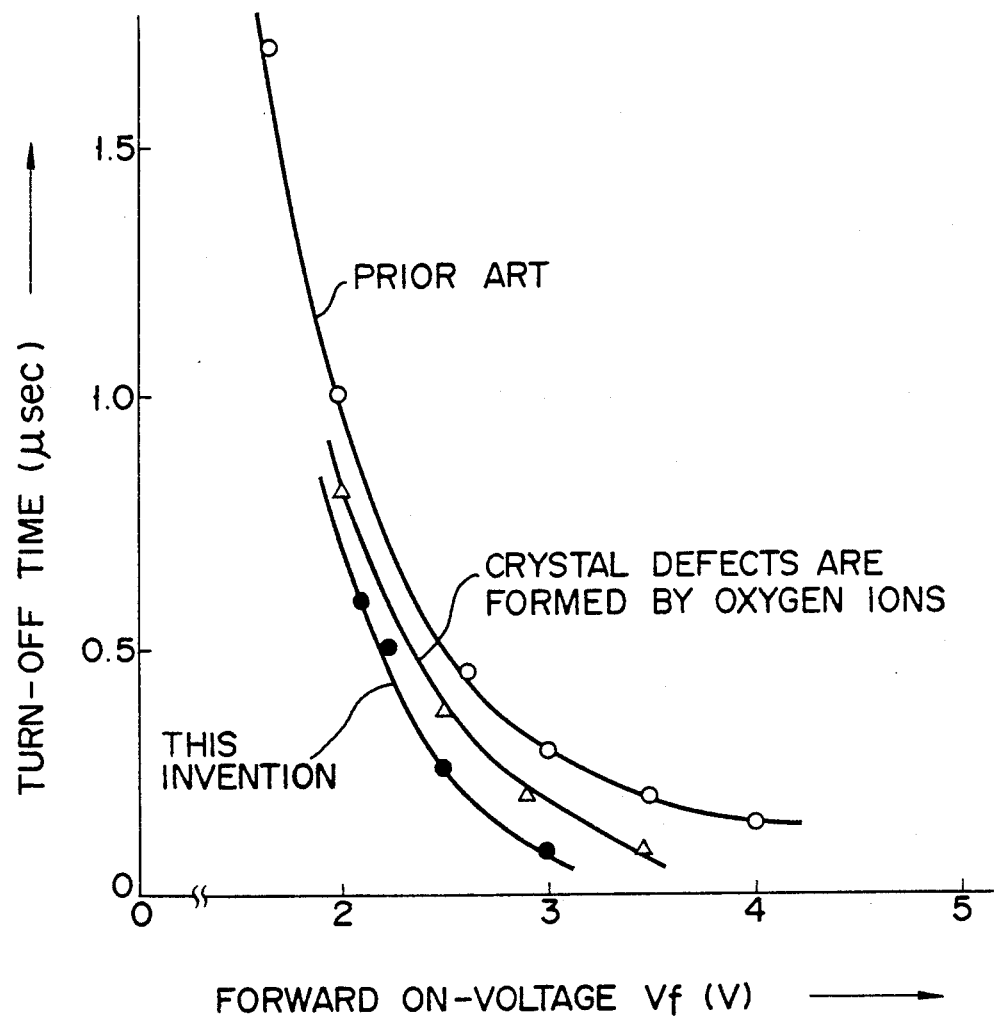
FIG. 3 shows the relation between the forward ON-voltage and turn-off time of IGBTs of the prior art and of this invention.

FIG. 3 shows the relation between the forward ON-voltage (Vf) and the turn-off time (μsec) of the IGBT of this invention and the conventional IGBT (in which a deep level is formed by application of an electron beam). As can be clearly seen from FIG. 3, the rate of increase in the forward ON-voltage Vf becomes small when, in the case of the embodiment of this invention, the turn-off time becomes less than 0.5 μsec, thus providing a significant effect.

Next, another case will be explained, in which O (oxygen) ions, instead of Ar ions, were ion-implanted with an acceleration voltage of 100 KeV and a dose amount of $3 \times 10^{15}$ atoms/cm$^2$, and other processes were effected in the same manner as in the first embodiment, to form an IGBT. In this case, a large proportion of the crystal defects were variously dislocated and exhibited properties different from those observed in the case wherein Ar ions were ion-implanted. FIG. 3 shows the relation between the forward ON-voltage (Vf) and the turn-off time (μsec) in the case where the crystal defects were formed by ion-implantation of O ions, together with those of the first embodiment of this invention and the conventional case. Like the first embodiment of this invention, the rate of increase in the forward ON-voltage Vf becomes small when the turn-off time becomes less than 0.5 μsec. However, the effect is not so significant as in the case of ion-implantation of Ar ions. This may be because the types of crystal defects formed by ion-implantation of Ar ions and O ions are different from each other as described before and the degree of crystal disturbance is large in the case of ion-implantation of Ar ions, thus increasing the number of crystal defects at the deep energy level in the case of ion-implantation of Ar ions. In fact, T. E. Seidel et al pointed out that Ar ions cause larger crystal disturbance than O ions (J. Appl. Phys, Vol 46, No. 2, 1975, P600).

The significant effect obtained by Ar ions may be attained by use of Kr, Xe and Rn which are the same sort of inert gas as Ar and have a larger atomic number or a combination of these atoms. Further, it is possible to use, other than the inert gas, tetravalent atoms such as Si, C and Ge or atoms such as Fe and Cl which are electrically inactive in Si. In this case, it is necessary to ion-implant more amount of atoms (for example, more than $10^{15}$ atoms/cm$^2$) but crystal defects (deep energy levels) can be formed although the amount thereof is small.

With the above construction, crystal defects 15 formed near junction plane 13 between semiconductor substrates 11 and 12 may act as the center of recombination of carriers, thereby shortening the lifetime of the carriers in the region. In the semiconductor device having the PN junction such as a power switching device like the IGBT and SCR, it is necessary to rapidly remove the excessive minority carriers, which have been accumulated in a specified active region such as the drain region during the period of ON state, at the time of transition from the ON state to the OFF state. The above crystal defects accelerate the rate of decrease in the excessive minority carriers, thus shortening the turn-off time.

In a case where the crystal defects are formed in order to suppress the rates of increases in the leak current (OFF current and reverse current) and ON-voltage (Vf) which are the problem in the prior art, it is necessary to limit the crystal defect forming area to a specified area so as not to affect the characteristic of the device. In this invention, composite semiconductor substrate 10 is used and the crystal defect forming area is set near junction plane 13 between two substrates 11 and 12. This is because the crystal defect forming area can be easily restricted in a specified area and set in a deep portion of substrate 10.

The crystal defects can be formed by application of electron beam or neutron beam, but in this case, it is difficult to limit the crystal defect forming area to a specified area. Therefore, it is preferable to form the crystal defects by introducing the atoms. It is not preferable that the carrier density in the active region of the device is largely changed by the introduction of the atoms to affect the characteristic of the device. Therefore, it is necessary to use atoms different from acceptor or donor as the atoms to be introduced. Further, it is preferable that the atoms introduced into the substrate may easily form the crystal defects and the thus formed crystal defects will not be changed during various heat treatments in the wafer process. As a result, it is most preferable to use Ar, Kr, Xe or Rn which has a large atomic weight or the combination of these atoms.

With the above construction, a high speed switching semiconductor device can be obtained in which the leak current is sufficiently suppressed, the rate of rise of the ON-voltage (Vf) is small and excellent turn-off characteristic can be attained.

Figure 4:
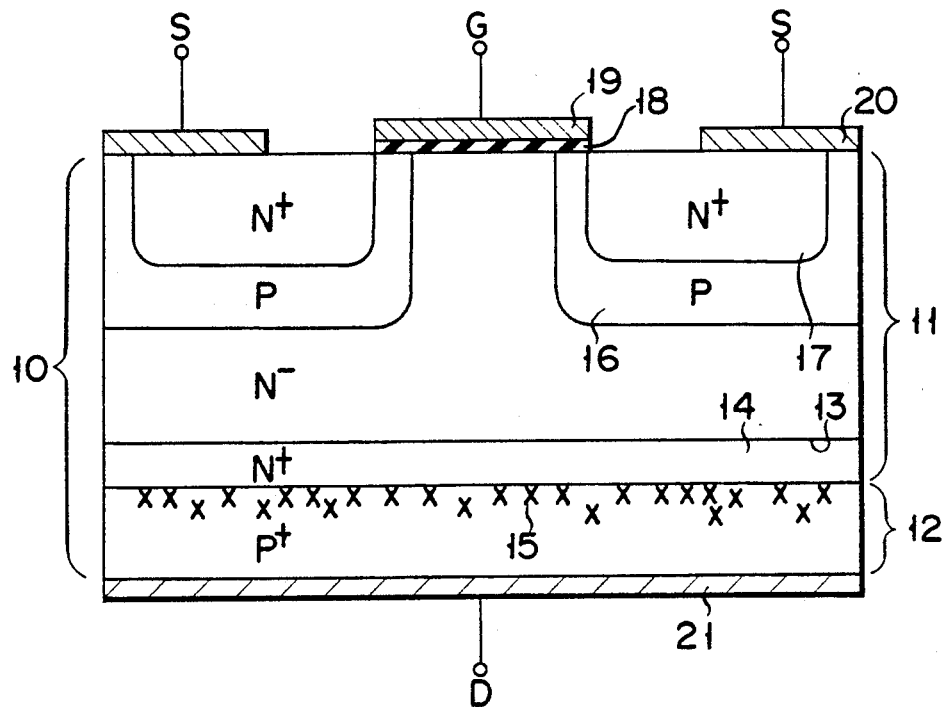
FIGS. 4 and 5 are cross sectional views of modifications of the IGBT shown in FIG. 1.
Figure 5:
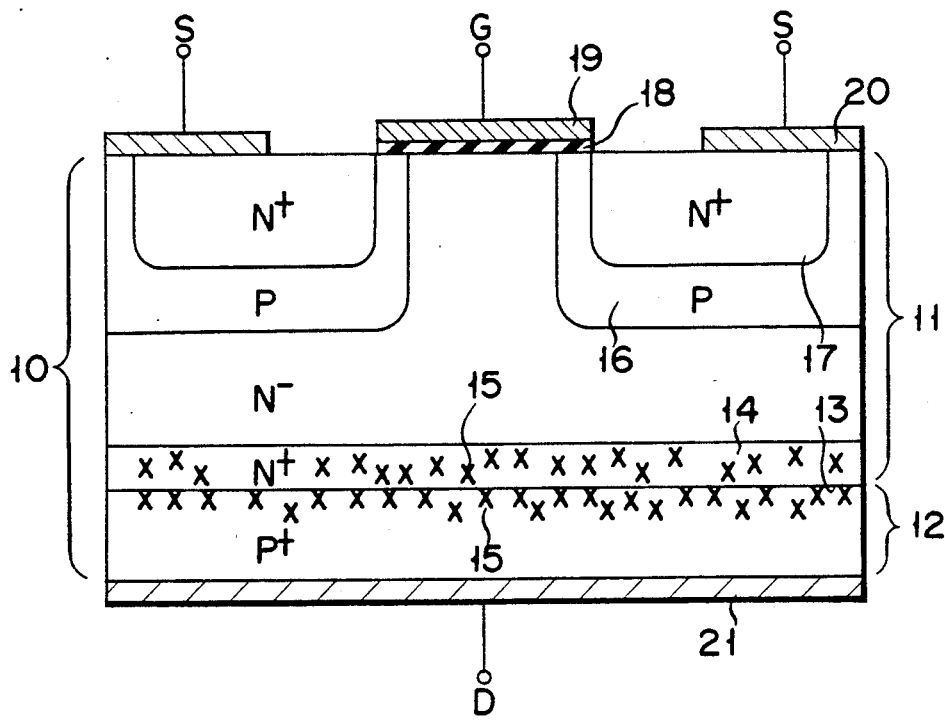

In the above embodiment, crystal defects 15 are formed in that portion of substrate 11 which lies near junction plane 13. However, as shown in FIG. 4, it is also possible to form crystal defects 15 in that portion of substrate 12 which lies near junction plane 13. In this case, the same effect can be attained. Further, it is possible to form crystal defects 15 in those portions of substrates 11 and 12 which lie on both sides of junction plane 13.

Figure 6:
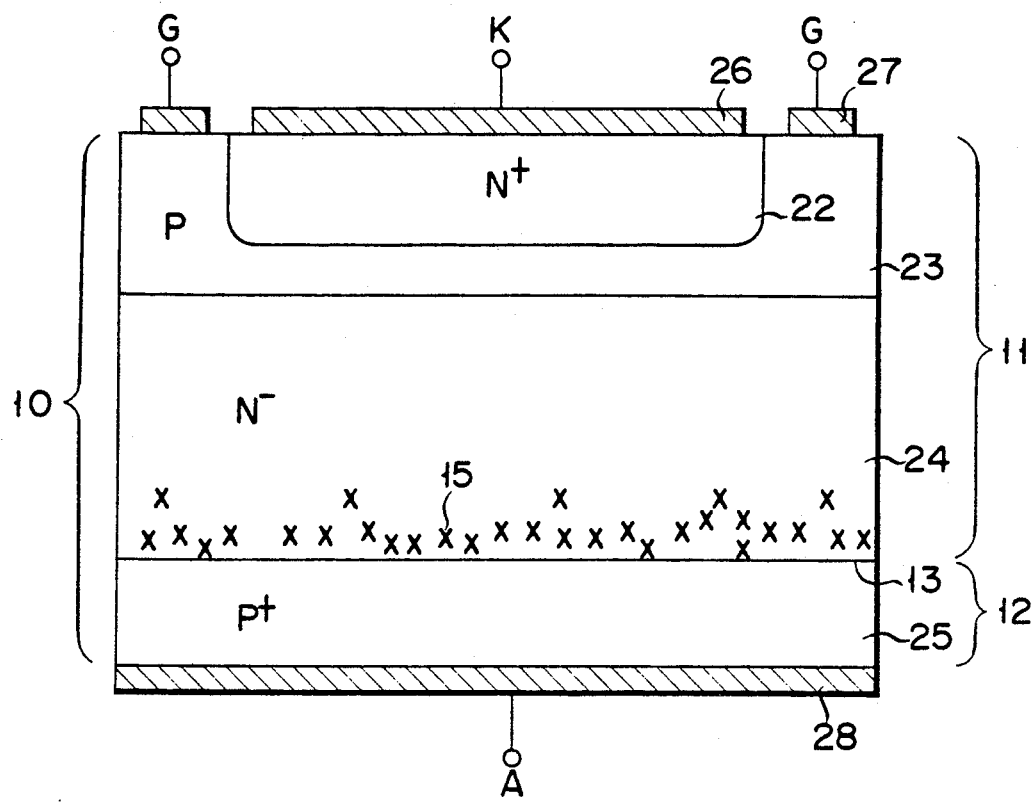
FIG. 6 is a cross sectional view of an SCR as a semiconductor device according to a second embodiment of this invention.

In the first embodiment, the IGBT is explained as an example. However, this invention can be applied to ordinary semiconductor elements such as GTO and SCR which require the high speed switching operation, and the same effect can be obtained. FIG. 6 is a cross sectional view showing the construction of a reverse blocking triode thyristor (SCR) according to a second embodiment of this invention. The semiconductor element is formed in composite substrate 10 formed by fixing substrates 11 and 12 in close contact with each other. The semiconductor element has an NPNP laminated structure of N+-type emitter region 22, P-type base region 23, N−-type base region 24 and P+-type emitter region 25. Cathode electrode 26 is formed on N+-type emitter region 22, and gate electrode 27 is formed on P-type base region 23. Anode electrode 28 is formed under P+-type emitter region 25. Further, crystal defects 15 are formed in that portion of substrate 11 which lies near junction plane 13.

The turn-off time of the SCR largely depends on the rate of recombination of excessive minority carriers in N−-type base region 24. The depletion layer caused by application of a forward bias voltage in the OFF state is formed in that portion of N−-type base region 24 which lies on the cathode side. For this reason, crystal defects 15 are formed in that portion of N−-type base region 24 which lies on the anode side. With this construction, increases in the leak current and ON-voltage of the SCR can be sufficiently suppressed and the turn-off time can be shortened.

Figure 7A:
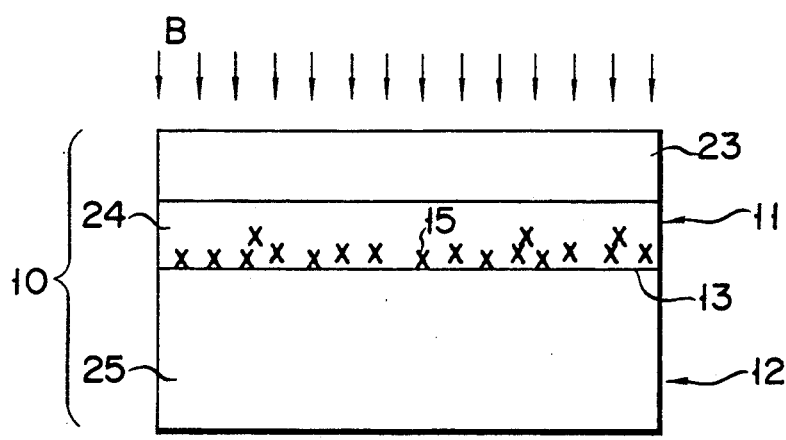
FIGS. 7A to 7C are cross sectional views sequentially showing the steps of manufacturing the SCR shown in FIG. 6.
Figure 7B:
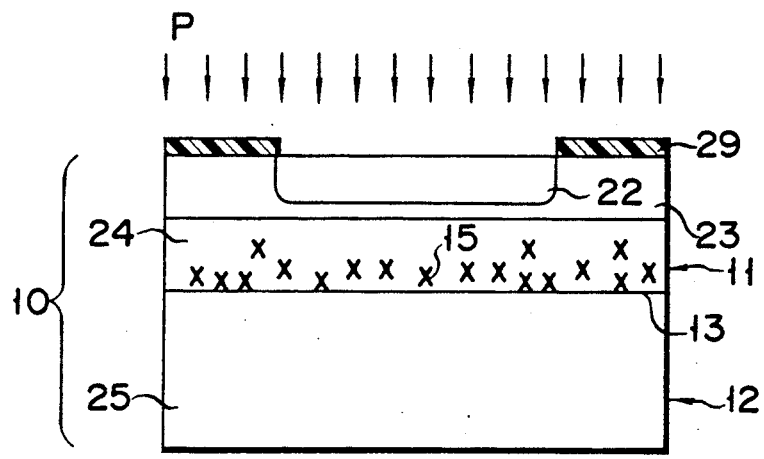
Figure 7C:
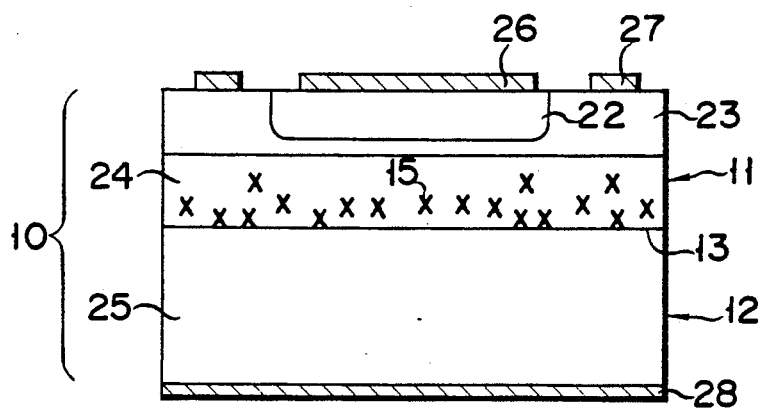

FIGS. 7A to 7C show the manufacturing process of the SCR shown in FIG. 6. The manufacturing steps effected to form composite substrate 10 are the same as those shown in FIGS. 2A to 2E. After this, as shown in FIG. 7A, P-type impurity such as boron is ion-implanted into the main surface area of substrate 10 to form P-type base region 23. An N−-type region of substrate 11 into which boron has not been ion-implanted acts as base region 24. Further, substrate 12 acts as emitter region 25.

Next, as shown in FIG. 7B, N-type impurity such as phosphorus is ion-implanted into the surface area of P-type base region 23 with resist pattern 29 used as a mask so as to form N+-type emitter region 22.

After this, anode electrode 26, gate electrode 27 and cathode electrode 28 are respectively formed on N+-type emitter region 22, P+-type base region 23 and the back surface of substrate 10 so as to form the SCR shown in FIG. 7C. Anode electrode 26, gate electrode 27 and cathode electrode 28 are each formed of aluminum or the like.

With this construction, like the first embodiment, crystal defects 15 formed near junction plane of substrates 11 and 12 act as the center of the recombination of carriers, shortening the lifetime of carriers in this area. As a result, excessive minority carriers accumulated in N−-type base region 24 can be rapidly removed, thus shortening the turn-off time. Further since crystal defects 15 are formed in a deep position and only in a specified region, increase in the forward ON-voltage (Vf) and the leak current can be suppressed to a minimum.

Figure 8:
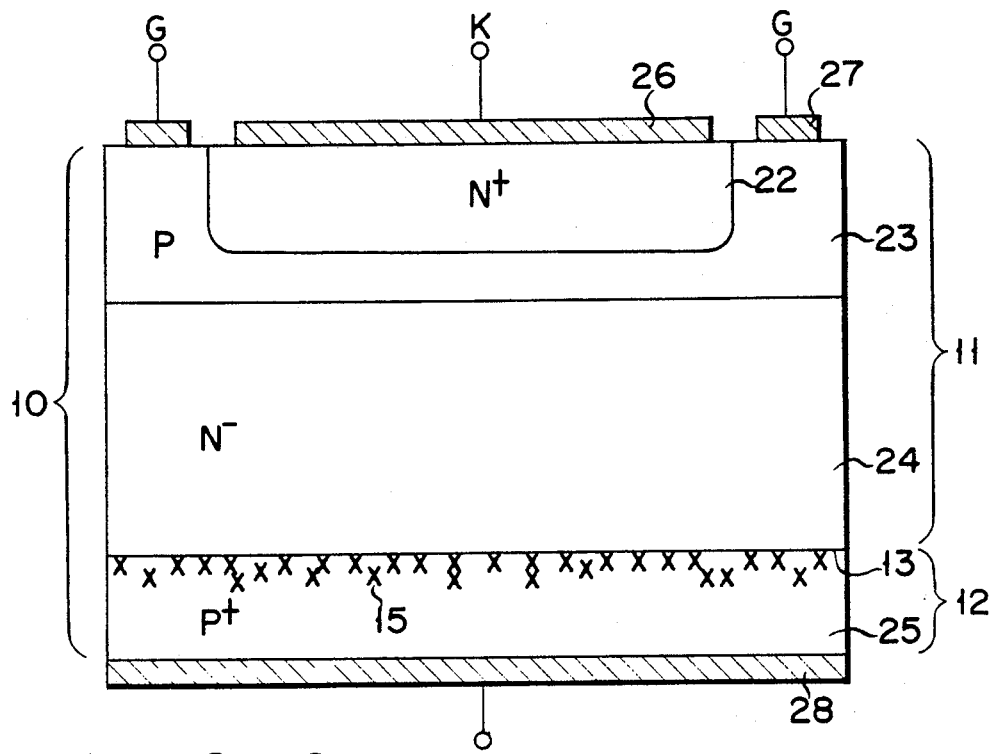
FIGS. 8 and 9 are cross sectional views of modifications of the SCR shown in FIG. 6.
Figure 9:
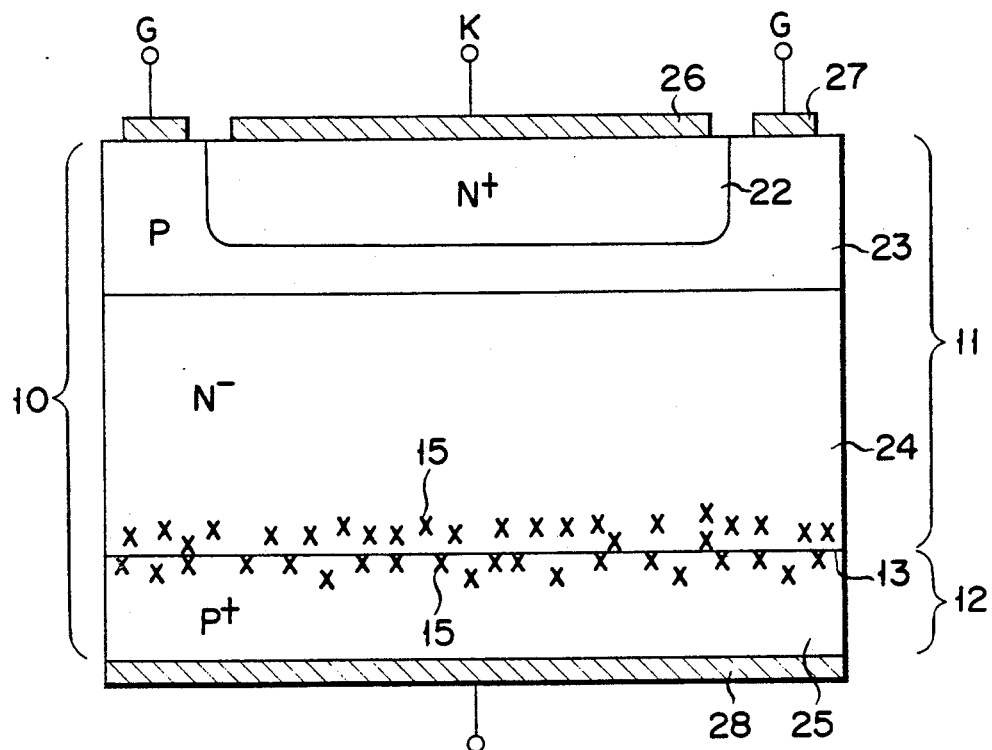

In the second embodiment, crystal defects 15 are formed in that surface area of substrate 11 which lies on the side of junction plane 13. However, the same effect can be obtained by forming crystal defects 15 in that surface area of substrate 12 which lies on the side of junction plane 13 as shown in FIG. 8. Further, it is also possible to form crystal defects 15 in those portions of substrates 11 and 12 which lie on both sides of junction plane 13 as shown in FIG. 9.

As described above, according to this invention, since a composite substrate in which crystal defects are formed in a restricted area near the junction plane of the two substrates is used, crystal defects (deep energy level) functioning as lifetime killer of the minority carriers can be formed in a desired portion of the substrate. Further, the number of deep energy levels can be easily controlled by properly selecting the number and the type of electrically inactive atoms to be ion-implanted. Therefore, the defect of the conventional semiconductor device in which crystal defects are distributed in an unwanted area, that is, the problem that the turn-off time cannot be shortened without increasing the forward ON-voltage and the leak current can be effectively solved. In this way, according to this invention, a high speed switching semiconductor device can be provided in which increase in the forward ON-voltage (Vf) and the leak current can be suppressed to a minimum and excellent turn-off characteristic can be obtained.

What is claimed is:

1. A semiconductor device comprising:
   a first semiconductor substrate having first and second surfaces;
   a second semiconductor substrate having a third surface in which crystal defects are formed in a surface region thereof, and a fourth surface, said third surface being directly bonded to the first surface of said first semiconductor substrate; and
   at least one semiconductor element formed in a composite substrate formed by directly bonding said first and second semiconductor substrates;
   wherein said crystal defects are formed by ion-implanting atoms into the surface region of said second semiconductor substrate, said atoms are selected from those which function as neither an acceptor or a donor in said second semiconductor substrate, and said atoms do not introduce oxygen into said second semiconductor substrate.

2. A semiconductor device according to claim 1, further comprising crystal defects formed in a surface region of said first surface of said first semiconductor substrate.

3. A semiconductor device according to claim 1, wherein said atoms are preferably selected from a group consisting of Ar, Kr, Xe, and Rn.

4. A semiconductor device according to claim 1, wherein said atoms are preferably a desired combination of atoms selected from a group consisting of Ar, Kr, Xe, and Rn.

5. A semiconductor device according to claim 1, wherein said first semiconductor substrate is of a first conductivity type and a high impurity concentration, said second semiconductor substrate is of a second conductivity type and a low impurity concentration, and said semiconductor element is an insulated gate bipolar transistor.

6. A semiconductor device according to claim 1, wherein said first semiconductor substrate is of a first conductivity type and a high impurity concentration, said second semiconductor substrate is of a second conductivity type and a low impurity concentration, and said semiconductor element is a reverse blocking triode thyristor.

7. A semiconductor device comprising:
   a composite substrate formed by fixing a first semiconductor substrate of a first conductivity type and a low impurity concentration, and a second semiconductor substrate of a second conductivity type and a high impurity concentration, crystal defects being formed in said composite substrate, near a junction plane of said first and second semiconductor substrates;
   a first impurity region, of the first conductivity type and a high impurity concentration, formed in a portion of said first semiconductor substrate which lies near the junction plane of said first and second semiconductor substrates;
   a second impurity region, of the second conductivity type, formed in a surface area of said composite substrate;
   a third impurity region, of the first conductivity type and a high impurity concentration, formed in a surface area of said second impurity region;
   a gate insulation film formed on a portion of said first semiconductor substrate surrounded by said second impurity region;
   a gate electrode formed on said gate insulation film;
   a source electrode formed on said second and third impurity regions; and
   a drain electrode formed on a back surface of said composite substrate;
   wherein said crystal defects are formed by ion-implanting atoms into a surface area of at least one of said first and second semiconductor substrates, said atoms are selected from those which function as neither an acceptor nor a donor in said first and second semiconductor substrates, and said atoms do not introduce oxygen into said at least one of said first and second semiconductor substrates.

8. A semiconductor device according to claim 7, wherein said atoms are preferably selected from a group consisting of Ar, Kr, Xe, and Rn.

9. A semiconductor device according to claim 7, wherein said atoms are preferably a desired combination of atoms selected from a group consisting of Ar, Kr, Xe, and Rn.

10. A semiconductor device comprising:
a composite substrate formed by fixing a first semiconductor substrate of a first conductivity type and a low impurity concentration, and a second semiconductor substrate of a second conductivity type and a high impurity concentration, crystal defects being formed in said composite substrate, near a junction plane of said first and second semiconductor substrates;
a first impurity region, of a second conductivity type, formed in a surface area of said composite substrate;
a second impurity region, of the first conductivity type and a high impurity concentration, formed in a surface area of said first impurity region;
a cathode electrode formed on said second impurity region;
a gate electrode formed on said first impurity region; and
an anode electrode formed on a back surface of said composite substrate;
wherein said crystal defects are formed by ion-implanting atoms into a surface area of at least one of said first and second semiconductor substrates, said atoms are selected from those which function as neither an acceptor nor a donor in said first and second semiconductor substrates, and said atoms do not introduce oxygen into said at least one of said first and second semiconductor substrates.

11. A semiconductor device according to claim 10, wherein said atoms are preferably selected from a group consisting of Ar, Kr, Xe, and Rn.

12. A semiconductor device according to claim 10, wherein said atoms are a desired combination of atoms selected from a group consisting of Ar, Kr, Xe, and Rn.

* * * * *